(12) United States Patent
Stautner

(10) Patent No.: US 9,958,519 B2
(45) Date of Patent: May 1, 2018

(54) THERMOSIPHON COOLING FOR A MAGNET IMAGING SYSTEM

(75) Inventor: Ernst Wolfgang Stautner, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 716 days.

(21) Appl. No.: 13/334,086

(22) Filed: Dec. 22, 2011

(65) Prior Publication Data

US 2013/0160975 A1 Jun. 27, 2013

(51) Int. Cl.
| | |
|---|---|
| *F25B 19/00* | (2006.01) |
| *G01R 33/38* | (2006.01) |
| *F28D 15/00* | (2006.01) |
| *H01F 6/04* | (2006.01) |
| *F28D 15/02* | (2006.01) |
| *G01R 33/3815* | (2006.01) |

(52) U.S. Cl.
CPC ......... *G01R 33/3804* (2013.01); *F28D 15/00* (2013.01); *F28D 15/0266* (2013.01); *H01F 6/04* (2013.01); *F25B 2400/17* (2013.01); *G01R 33/3815* (2013.01); *H01L 2924/0002* (2013.01)

(58) Field of Classification Search
CPC ......... F17C 3/085; F17C 2227/03–2227/0381; G01R 33/3804; G01R 33/3815; F28D 15/00; F28D 15/0266; H01F 6/04; F25B 2400/17; H01L 2924/0002
USPC ........................................................ 62/51.1
See application file for complete search history.

(56) References Cited

U.S. PATENT DOCUMENTS

| | | | |
|---|---|---|---|
| 3,691,784 A * | 9/1972 | Nicholds et al. | ................ 62/218 |
| 4,399,807 A | 8/1983 | Buckley et al. | |
| 4,578,962 A | 4/1986 | Dustmann | |
| 5,461,873 A | 10/1995 | Longsworth | |
| 5,586,437 A * | 12/1996 | Blecher | ..................... F25B 9/00 62/47.1 |

(Continued)

FOREIGN PATENT DOCUMENTS

| | | | |
|---|---|---|---|
| CN | 1684207 A | 10/2005 | |
| CN | 201178012 Y | 1/2009 | |
| CN | 101783220 A | 7/2010 | |
| EP | 1586833 A2 * | 10/2005 | ................ F25B 9/02 |

(Continued)

OTHER PUBLICATIONS

Stautner et al., "A New Cooling Technology for the Cooling of HTS Magnets", IEEE Transactions on Applied Superconductivity, vol. 17, Issue 2, pp. 2200-2203, Jun. 2007.

(Continued)

*Primary Examiner* — Len Tran
*Assistant Examiner* — Gordon Jones
(74) *Attorney, Agent, or Firm* — Pabitra K. Chakrabarti

(57) ABSTRACT

A thermosiphon cooling system is presented. One embodiment of the thermosiphon cooling system includes a reservoir having a first portion configured to store a liquid coolant. The thermosiphon cooling system also includes a tubing unit coupled to the reservoir and disposed adjacent to at least one superconducting unit to be cooled and configured to receive the liquid coolant from the first portion of the reservoir, and circulate the received liquid coolant within the tubing unit to dissipate heat generated by the at least one superconducting unit. The received liquid coolant is circulated within the tubing unit by varying a density of the received liquid coolant at different portions of the tubing unit.

16 Claims, 6 Drawing Sheets

(56) References Cited

U.S. PATENT DOCUMENTS

| | | | |
|---|---|---|---|
| 6,164,078 A * | 12/2000 | Lak et al. | 62/47.1 |
| 6,923,009 B2 * | 8/2005 | Kudaravalli | 62/51.1 |
| 7,263,841 B1 * | 9/2007 | Arman et al. | 62/51.1 |
| 7,464,558 B2 * | 12/2008 | Huang et al. | 62/51.1 |
| 7,497,086 B2 | 3/2009 | Atkins et al. | |
| 2006/0236709 A1 * | 10/2006 | Steinmeyer | G01R 33/3815 62/259.2 |
| 2007/0227529 A1 | 10/2007 | Rubio et al. | |
| 2008/0209919 A1 | 9/2008 | Ackermann et al. | |
| 2009/0107151 A1 * | 4/2009 | Clayton et al. | 62/48.3 |
| 2009/0275478 A1 * | 11/2009 | Atkins | F25D 3/12 505/163 |
| 2009/0280989 A1 * | 11/2009 | Astra et al. | 505/163 |
| 2010/0089073 A1 * | 4/2010 | Laskaris et al. | 62/51.1 |
| 2010/0281885 A1 * | 11/2010 | Black et al. | 62/46.1 |
| 2011/0056218 A1 * | 3/2011 | Blakes | H01F 6/02 62/51.1 |
| 2011/0147146 A1 * | 6/2011 | Brewen et al. | 188/267 |
| 2011/0179809 A1 * | 7/2011 | Zhang et al. | 62/51.1 |
| 2011/0301038 A1 | 12/2011 | Stautner et al. | |
| 2014/0107468 A1 * | 4/2014 | Calvert | A61B 5/055 600/411 |
| 2017/0117076 A1 * | 4/2017 | Miyazoe | H01F 6/04 |

FOREIGN PATENT DOCUMENTS

| | | |
|---|---|---|
| EP | 1587114 A2 | 10/2005 |
| GB | 2422654 A | 8/2006 |
| GB | 2427672 A | 1/2007 |

OTHER PUBLICATIONS

Stautner et al., "The Cryogenics of a Thermosiphon-Cooled HTS MRI Magnet-Assembly and Component Testing", IEEE Transactions on Applied Superconductivity, vol. 21, Issue 3, pp. 2096-2099, Jun. 2011.

M.A. Green, "How the Performance of a Superconducting Magnet is Affected by the Connection between a Small Cooler and the Magnet", IEEE Transactions on Applied Superconductivity, vol. 16, Issue 2, pp. 1330-1333, Jun. 2006.

Premium Solar, "Thermosiphon Water Heater System Performance", downloaded from "http://www.presolarnet.com/products/thermosiphon_how_works.htm" on Feb. 25, 2014.

Chiras, "Solar Water Heating at Home: Thermosiphon Systems", downloaded from http://www.ecomii.com/building/thermosiphon-solar on Feb. 25, 2014.

Search report from GB dated May 22, 2013, Application No. GB1222269.1_Filed on Dec. 11, 2012, 7Pages.

Lottin et al., "Liquid Helium Thermosiphon for the 4 Tesla CMS Solenoid", Advances in Cryogenic Engineering, vol. No. 43, pp. 1505-1511, 1998.

Schwenterly et al., "Design and Operating Performance of Cryocooled Helium Thermosiphon Loops for HTS Transformers", Transactions of the Cryogenic Engineering Conference, vol. No. 49, pp. 839-848, 2004.

Rao et al., "Stability Behavior of a Natural Circulation Loop With End Heat Exchangers", Journal of Heat Transfer, vol. No. 127, pp. 749-759, Jul. 2005.

Bredy et al., "Experimental and Theoretical Study of a Two Phase Helium High Circuliation Loop", Transactions of the Cryogenic Engineering Conference, vol. No. 51, pp. 496-503, 2006.

Dobson., "Flow and heat transfer in a closed loop thermosyphon Part II—experimental simulation", Journal of Energy in Southern Africa, vol. No. 18, Issue No. 3, pp. 41-48, Aug. 2007.

Unofficial English translation of Chinese Office Action issued in connection with corresponding CN Application No. 201210565233.7 dated Jan. 28, 2016.

* cited by examiner

THERMOSIPHON COOLING FOR A MAGNET IMAGING SYSTEM

BACKGROUND

The disclosure relates generally to magnetic resonance imaging (MRI) systems and more specifically to a thermosiphon cooling system and method for cooling superconducting magnets in MRI systems.

A superconducting magnet is used to produce a magnetic field in MRI systems. In some methods, an electric current from a power source is constantly applied to the superconducting magnet to produce the magnetic field. However, production of such a strong magnetic field entails a constant supply of the electric current in a range of hundreds of amperes. This constant supply of electric current to the superconducting magnet increases the running cost of the MRI system.

Furthermore, in certain other techniques, the superconducting magnet may be subjected to different heat loads in the MRI system. It is desirable to transfer these heat loads away from the superconducting unit to maintain the superconducting magnet at a cryogenic temperature and to operate the superconducting magnet in the superconducting state. Moreover, it is also desirable to optimally dissipate the heat from the superconducting magnet to transition the superconducting magnet from a normal state to a superconducting state without high boil-off of cryogen in the MRI system.

In a conventional system, superconducting magnets/coils are housed in a helium vessel containing about 1500 to about 2000 liters of liquid helium (He) to provide immersion cooling of the superconducting magnets/coils. Since this arrangement employs a large vessel with thousands of liters of liquid He, the arrangement is not only expensive to manufacture, but also heavy to transport and install at a desired location, such as, diagnostic centers. Additionally, the refill of thousands of liters of liquid He for delivery to remote locations may be inconvenient.

Moreover, the liquid He in these systems can sometimes boil-off during a quench event. The boiled-off helium escapes from the cryogen bath in which the magnetic coils are immersed. Thus, each quench event is followed by re-filling of the liquid He and re-ramping of the magnet, which is an expensive and time consuming event. Additionally, in conventional magnetic devices, a sophisticated exterior venting system is needed to vent the gas, such as the boiled-off He, through venting pipe stacks after the magnet and/or the switch quenches. However, the venting pipes are difficult to install. Also, in some situations, the venting of He can have environmental or regulatory concerns. Thus, conventional MRI magnet designs and their cooling arrangements can entail special installation requirements, the inability to install these systems in certain regions, and a high maintenance cost.

BRIEF DESCRIPTION

Briefly in accordance with one aspect of the present technique, a thermosiphon cooling system is presented. The thermosiphon cooling system includes a reservoir having a first portion configured to store a liquid coolant. The thermosiphon cooling system also includes a tubing unit coupled to the reservoir and disposed adjacent to at least one superconducting unit to be cooled and configured to receive the liquid coolant from the first portion of the reservoir, and circulate the received liquid coolant within the tubing unit to dissipate heat generated by the at least one superconducting unit. The received liquid coolant is circulated within the tubing unit by varying a density of the received liquid coolant at different portions of the tubing unit.

In accordance with further aspects of the present technique, a method for cooling a superconducting unit is presented. The method includes storing a liquid coolant in a first portion of a reservoir. The method further includes coupling one end of a tubing unit to at least one superconducting unit and the other end of the tubing unit to the reservoir. The method also includes receiving, by the tubing unit, the liquid coolant from the first portion of the reservoir. In addition, the method includes circulating the received liquid coolant within the tubing unit to dissipate heat generated by the at least one superconducting unit. The received liquid coolant is circulated within the tubing unit by varying a density of the received liquid coolant at different portions of the tubing unit.

In accordance with another aspect of the present technique, a system is presented. The system includes at least one superconducting unit configured to produce a magnetic field. The system also includes a thermosiphon cooling subsystem coupled to the superconducting unit and configured to dissipate heat generated by the superconducting unit while producing the magnetic field. The thermosiphon cooling subsystem includes a reservoir having a first portion configured to store a liquid coolant. The thermosiphon cooling subsystem further includes a tubing unit coupled to the reservoir and disposed adjacent to at least one superconducting unit to be cooled, and configured to receive the liquid coolant from the first portion of the reservoir, and circulate the received liquid coolant within the tubing unit to dissipate the heat generated by the at least one superconducting unit. The received liquid coolant is circulated within the tubing unit by varying a density of the received liquid coolant at different portions of the tubing unit.

In accordance with yet another aspect of the present technique, a thermosiphon cooling kit for cooling at least one superconducting unit is presented. The kit includes a reservoir having a first portion configured to store a liquid coolant. The kit further includes a tubing unit coupled to the reservoir and disposed adjacent to the at least one superconducting unit to be cooled, and configured to receive the liquid coolant from the first portion of the reservoir, and circulate the received liquid coolant within the tubing unit to dissipate heat generated by the at least one superconducting unit. The received liquid coolant is circulated within the tubing unit by varying a density of the received liquid coolant at different portions of the tubing unit.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As will be described in detail hereinafter, various embodiments of an exemplary thermosiphon cooling system and methods for cooling superconducting magnets/coils are presented. By employing the methods and the various embodiments of the thermosiphon cooling system described hereinafter, volume of liquid coolant, size of the magnetic devices, cost of manufacturing, cost of installing, and cost of running the magnetic devices, such as magnetic resonance imaging (MRI) systems may be substantially reduced.

Figure 1:
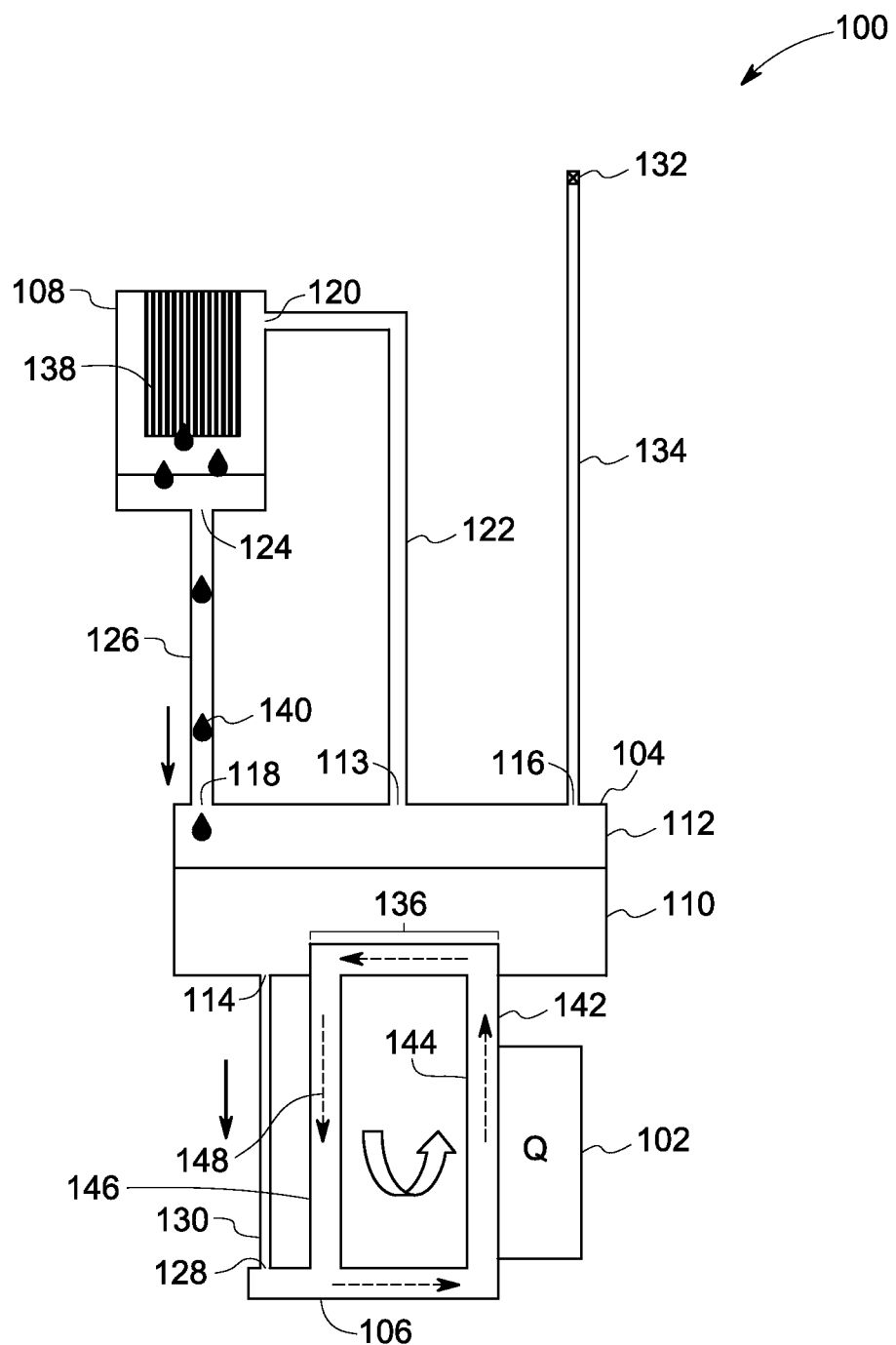
FIG. 1 is a cross-sectional view of a thermosiphon cooling system, in accordance with aspects of the present technique.

Turning now to the drawings, and referring to FIG. 1, a cross-sectional view of a thermosiphon cooling system 100, in accordance with aspects of the present technique, is depicted. The thermosiphon cooling system 100 may be configured to maintain a temperature of a superconducting unit 102 at or below a cryogenic temperature. The superconducting unit 102 may include superconducting magnets and/or coils, a gradient system, and their supporting structure held within the MRI system. Particularly, the thermosiphon cooling system 100 is configured to cool or dissipate heat from the superconducting unit 102 so that the temperature associated with the superconducting unit 102 is maintained at or below the cryogenic temperature. The term cryogenic temperature is used to refer to a temperature at or below which the superconducting unit 102 is designed to operate in a superconducting state. In one embodiment, the cryogenic temperature may be in a range from about 4.2 K to about 4.8 K.

In a presently contemplated configuration, the thermosiphon cooling system 100 may include a reservoir 104, a tubing unit 106, and a condensing unit 108. The reservoir 104 is configured to store a liquid coolant, while the tubing unit 106 is configured to absorb heat generated by the superconducting unit 102. The condensing unit 108 is configured to condense an evaporated coolant received from the reservoir 104. In one embodiment, the thermosiphon cooling system 100 may be disposed in a vacuum chamber of the MRI system (see FIG. 7). It may be noted that the implementation of the thermosiphon cooling system 100 is not limited to MRI systems, and may be implemented in other devices, such as superconducting electrical machines, superconducting magnet energy storage systems (SMES), SC accelerators, and the like.

Further, in one embodiment, the reservoir 104 is coupled to the tubing unit 106 and the condensing unit 108. The reservoir 104 may be configured to receive the liquid coolant from the condensing unit 108 and supply a portion of the received liquid coolant to the tubing unit 106. The liquid coolant may include liquid helium (LHe), liquid hydrogen ($LH_2$), liquid neon (LNe), liquid nitrogen ($LN_2$), or combinations thereof. In one embodiment, the superconducting unit 102 may be a low temperature superconductor, a medium temperature superconductor, or a high temperature superconductor. Also, the liquid coolant may be selected based on the type of superconductor used in the superconducting unit 102. For example, the superconducting unit 102 having a low temperature superconductor may employ LHe as the coolant. Similarly, for a medium temperature superconductor, LHe, LNe, or $LH_2$ may be used as the coolant. Furthermore, for a high temperature superconductor, LHe, $LH_2$, LNe, or $LN_2$ may be used as the coolant.

Moreover, in one example, the reservoir 104 includes a first portion 110 and a second portion 112. Also, in one embodiment, the first portion 110 may be at the bottom of the reservoir 104, while the second portion 112 may be located over the first portion 112 of the reservoir 104. The first portion 110 of the reservoir 104 is used to store the liquid coolant that is received from the condensing unit 108, while the second portion 112 of the reservoir 104 is used to collect the coolant that is evaporated from the first portion 110 of the reservoir 104. It may be noted that the second portion 112 of the reservoir 104 may also be referred to as ullage space. For ease of understanding, the coolant in the first portion 110 of the reservoir 104 may be referred to as the liquid coolant and the coolant in the second portion 112 of the reservoir 104 may be referred to as an evaporated coolant.

In addition, the reservoir 104 may include a first outlet 113, a second outlet 114, a third outlet 116, and a first inlet 118. Also, the condensing unit 108 may include an inlet 120 and an outlet 124. The first outlet 113 of the reservoir 104 is coupled to the inlet 120 of the condensing unit 108 via a first channel 122, while the first inlet 118 of the reservoir 104 is coupled to the outlet 124 of the condensing unit 108 via a second channel 126. Moreover, the first outlet 113 of the reservoir 104 is configured to convey the evaporated coolant from the second portion 112 of the reservoir 104 to the condensing unit 108. For example, when the liquid coolant in the first portion 110 of the reservoir 104 absorbs heat from the tubing unit 106, a portion of the liquid coolant evaporates and settles in the second portion 112 of the reservoir 104. This evaporated coolant is then conveyed to the condensing unit 108 through the first outlet 113 of the reservoir 104. Further, the first inlet 118 of the reservoir 104 is configured to receive the condensed liquid coolant from the condensing unit 108.

Also, the tubing unit 106 may include an inlet 128. Furthermore, the second outlet 114 of the reservoir 104 is coupled to the inlet 128 of the tubing unit 106 via a third channel 130. The second outlet 114 of the reservoir 104 is configured to convey a portion of the liquid coolant that is stored in the first portion 110 of the reservoir 104 to the tubing unit 106. For example, the tubing unit 106 is initially filled with liquid coolant received from the reservoir 104 via the third channel 130. Furthermore, the third outlet 116 of the reservoir 104 may be coupled to a release valve 132 via a fourth channel 134. The release valve 132 is configured to release any in-built pressure in the reservoir 104. In one embodiment, the third outlet 116 may be directly coupled to the release valve 132 without employing the fourth channel 134.

In accordance with aspects of the present technique, the tubing unit 106 may be coupled to the reservoir 104 and disposed adjacent to/proximate to at least a portion of the superconducting unit 102 that needs to be cooled. It may be noted that in certain embodiments, the tubing unit 106 may be disposed on at least the portion of the superconducting unit 102. In one exemplary embodiment, one end of the tubing unit 106 may be coupled to the reservoir 104 and the other end of the tubing unit 106 may be coupled to the at least one superconducting unit 102. The tubing unit 106 is configured to absorb the heat that is generated by the superconducting unit 102. For example, while operating the superconducting unit 102 in a normal state, transient heat loads may be imposed on the superconducting unit 102. The transient heat loads may be due to high EPI gradient switching sequences. In addition to the heat generated by the gradient system, the superconducting unit 102 may also receive other heat loads by thermal radiation from a vacuum space and thermal conduction due to a magnet suspension system. These transient heat loads are absorbed by the tubing unit 106 to reduce the temperature of the superconducting unit 102 to the cryogenic temperature or below the cryogenic temperature.

Further, in one embodiment, the tubing unit 106 may be a cyclic tubing loop with the inlet 128 at one end of the tubing unit 106, as depicted in FIG. 1. The inlet 128 may be employed to continually fill the tubing unit 106 with the liquid coolant that is received from the first portion 110 of the reservoir 104 via the third channel 130. Also, in one embodiment, the tubing unit 106 may be formed using stainless steel, aluminum, copper, and the like. The tubing unit 106 so formed is configured to enable flow of the liquid coolant into the tubing unit 106 only via the inlet 128. Additionally, the tubing unit 106 also aids in transferring the heat from the superconducting unit 102 to the liquid coolant within the tubing unit 106. Further, the liquid coolant within the tubing unit 106 is configured to transfer this absorbed heat to the liquid coolant in the first portion 110 of the reservoir 104.

Additionally, a portion 136 of the tubing unit 106 may be coupled to the reservoir 104, in one embodiment. However, in certain other embodiments, the portion 136 of the tubing unit 106 may be disposed within the reservoir 104. For example, the portion 136 of the tubing unit 106 may be welded, brazed, soldered or bonded otherwise to the bottom of the reservoir 104 so that at least the portion 136 of the tubing unit 106 and the reservoir 104 are thermally coupled to each other. In another example, the reservoir 104 may be provided with two apertures that are separated by a determined distance at the bottom of the reservoir 104. In this embodiment, the portion of the tubing unit 136 may be disposed within the reservoir 104 via use of the two apertures. Thus, only the portion 136 of the tubing unit 106 is disposed within the reservoir 104, while the remaining portion of the tubing unit 106 is positioned outside the reservoir 104. In one embodiment, the portion 136 of the tubing unit 106 may be coupled to a heat exchanger (not shown in FIG. 1). The heat exchanger may be configured to distribute the heat absorbed by the coolant in the tubing unit 106 to the liquid coolant in the first portion 110 of the reservoir 104. This embodiment is explained in greater detail with reference to FIG. 4. In another embodiment, the portion 136 of the tubing unit 106 may be coupled to a perforated tube (not shown in FIG. 1) to convey or release gas bubbles from the tubing unit 106 to the reservoir 104. This embodiment is explained in greater detail with reference to FIG. 5.

In an alternative embodiment, the portion 136 of the tubing unit 106 may be inclined by an angle of about 5 degrees from a base of the reservoir 104 to eliminate accumulation of gas bubbles, also known as warm-gas pockets, in the tubing unit 106. For example, the end of the portion 136 that receives the coolant from a first leg 142 of the tubing unit 106 is disposed on the base of reservoir 104, while the other end of the portion 136 that conveys the coolant to a second leg 146 is positioned away from the base of the reservoir 104. In one embodiment, the tubing unit 106 may have a channel diameter in a range from about 0.58 mm to about 5 mm to allow the gas bubbles to travel towards the portion 136 of the tubing unit 106.

In accordance with aspects of the present technique, the condensing unit 108 is coupled to the reservoir 104 and configured to condense the evaporated coolant that is received from the second portion 112 of the reservoir 104. Further, the condensed coolant is conveyed back to the first portion 110 of the reservoir 104. The condensing unit 108 includes the inlet 120, a condenser 138, and the outlet 124, in one embodiment. The inlet 120 of the condensing unit 108 is configured to receive the evaporated coolant from the second portion 112 of the reservoir 104. Further, the received evaporated coolant is conveyed to the condenser 138. The condenser 138 is configured to condense the received evaporated coolant to form condensed liquid coolant. Thereafter, the outlet 124 is configured to convey the condensed liquid coolant to the first portion 110 of the reservoir 104. This conveyed liquid coolant is shown as liquid droplets 140 in FIG. 1. In one embodiment, the condensing unit 108 may be disposed within the reservoir 104, particularly in the second portion 112 of the reservoir 104, to condense the evaporated coolant collected in the second portion 112 of the reservoir 104.

To understand the functioning of the thermosiphon cooling system 100, it may be assumed that the tubing unit 106 and the first portion 110 of the reservoir 104 are initially filled with liquid coolant. Further, the liquid coolant within the tubing unit 106 is circulated to dissipate the heat generated by the at least one superconducting unit 102. In accordance with exemplary aspects of the present technique, the liquid coolant is circulated by varying a density of the liquid coolant at different portions of the tubing unit 106. Particularly, the tubing unit 106 that is disposed over the superconducting unit 102 is configured to absorb the heat generated by the superconducting unit 102 to reduce the temperature of the superconducting unit 102 to a temperature at or below the cryogenic temperature. This absorbed heat is transferred to the liquid coolant within the tubing unit 106, which in turn reduces the density of the liquid coolant within the tubing unit 106. More specifically, the liquid coolant within the tubing unit 106 becomes lighter upon absorbing the heat generated by the superconducting unit 102.

Furthermore, the coolant with the reduced density travels along the first leg 142 of the tubing unit 106 towards the portion 136 of the tubing unit 106 that is coupled to or disposed within the reservoir 104. A direction of movement of the coolant in the first leg 142 is generally depicted by reference numeral 144 in FIG. 1. Thereafter, at the portion 136 of the tubing unit 106, the coolant with reduced density is cooled down by transferring the absorbed heat from the coolant within the tubing unit 106 to the liquid coolant in the first portion 110 of the reservoir 104.

In addition, at the reservoir 104, the transfer of heat from the coolant in the portion 136 of the tubing unit 106 to the liquid coolant in the first portion 110 of the reservoir 104 results in the evaporation of a portion of the liquid coolant in the first portion 110 of the reservoir 104. This evaporated coolant is collected in the second portion 112 of the reservoir 104 and conveyed to the condensing unit 108 via the first channel 122. At the condensing unit 108, the evaporated coolant is condensed and conveyed back to the reservoir 104 as liquid coolant via the second channel 126.

Referring again to the tubing unit 106, after transferring the absorbed heat to the liquid coolant in the first portion 110 of the reservoir 104, the density of the coolant in the portion 136 of the tubing unit 106 increases. This increase in density may result in the collapsing and/or reduction in the size and/or number of the gas bubbles generated in the tubing unit 106. This liquid coolant then travels along the second leg 146 of the tubing unit 106 towards the superconducting unit 102. A direction of movement of the condensed liquid coolant in the second leg 146 is generally indicated by a reference numeral 148 in FIG. 1. As the liquid coolant travels along the second leg 146, the liquid coolant continues to absorb the heat generated by the superconducting unit 102. This cycle is repeated, causing the liquid coolant to circulate within the tubing unit 106, as depicted in FIG. 1.

As previously noted, in a conventional bath-cooled MRI system, the superconducting unit is typically immersed in the coolant vessel containing liquid He. While cooling the superconducting unit, the liquid He is evaporated and vented out of the MRI system to an external environment. Further, to compensate for this vented liquid He, the coolant vessel is re-filled with liquid He, which is an expensive and time consuming event. In addition, this arrangement requires few hundreds of liters of liquid He to re-fill the coolant vessel. Some or all of these shortcomings of the currently available persistent current switches may be circumvented via use of embodiments consistent with the example thermosiphon cooling system 100.

In accordance with aspects of the present technique, the reservoir 104 and the tubing unit 106 are filled with about 10 liters of liquid coolant to cool the superconducting unit 102. This reduced amount of liquid coolant is efficiently utilized by circulating the coolant within the tubing unit 106. Particularly, the coolant is circulated by varying a density of the liquid coolant at different portions of the tubing unit 106. This circulation of the liquid coolant in the tubing unit 106 enhances the transfer of heat from the superconducting unit 102, which in turn minimizes boil-off of the liquid coolant. This reduction in the boil-off advantageously minimizes the need for refilling of the coolant in the MRI system. Also, since the coolant is re-condensed and reused in the tubing unit 106, use of hundreds of liters of coolant in MRI systems may be circumvented. This in turn reduces the manufacturing cost and the weight of the MRI systems.

Figure 2:
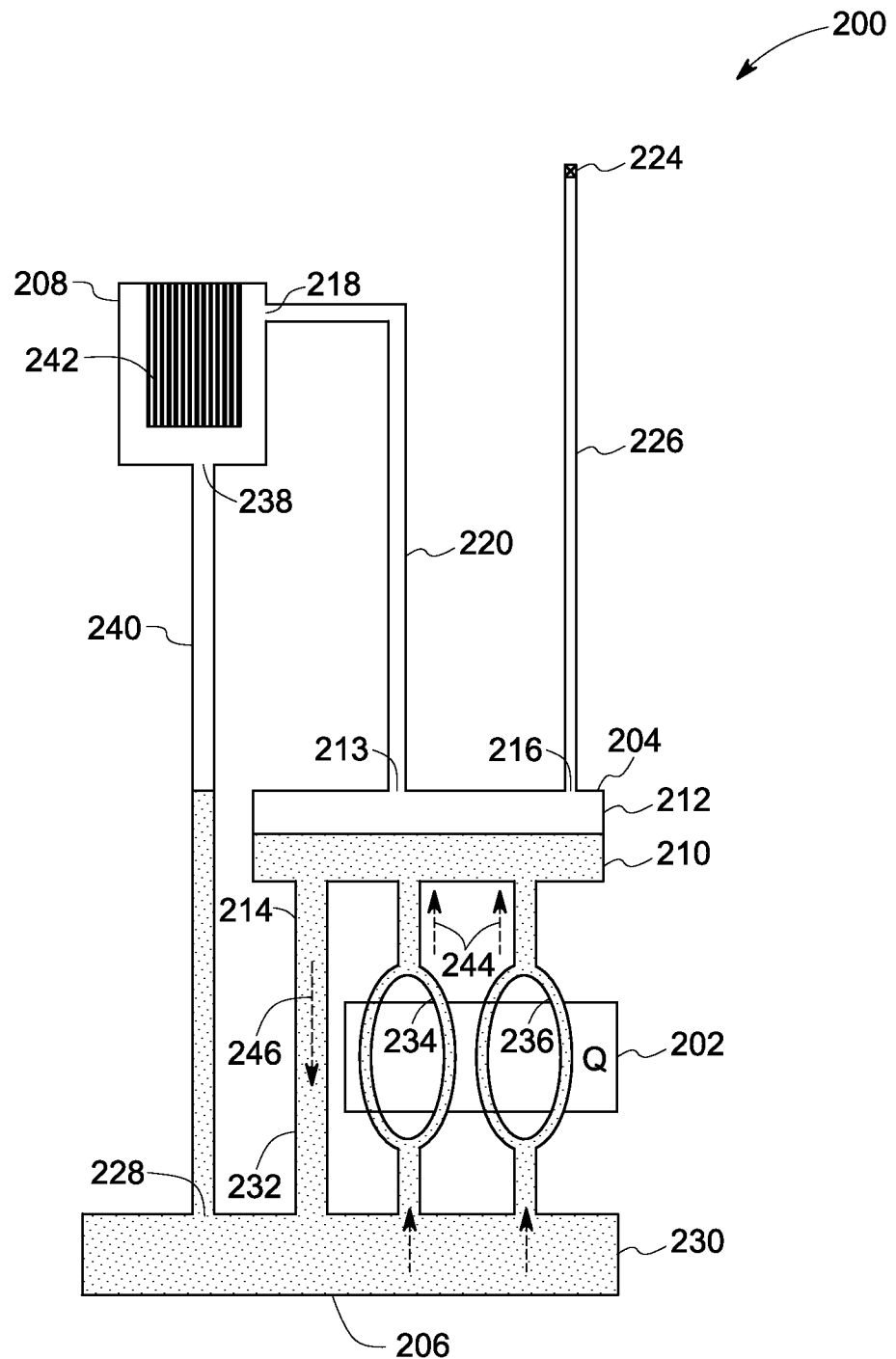
FIG. 2 is a cross-sectional view of another embodiment of a thermosiphon cooling system, in accordance with other aspects of the present technique.

Referring to FIG. 2, a cross-sectional view of another embodiment of a thermosiphon cooling system 200, in accordance with other aspects of the present technique, is depicted. The thermosiphon cooling system 200 may be configured to maintain a temperature of one or more superconducting units 202 at or below a cryogenic temperature. The one or more superconducting units 202 may include superconducting magnets and/or coils, and their supporting structures, such as persistent current switches, held within the MRI system.

In a presently contemplated configuration, the thermosiphon cooling system 200 includes a reservoir 204, a tubing unit 206, and a condensing unit 208. The reservoir 204 is configured to cool or condense an evaporated coolant received from the tubing unit 206. The tubing unit 206 is configured to absorb heat dissipated by the superconducting unit 202, while the condensing unit 208 is configured to condense an evaporated coolant received from the reservoir 204. In one exemplary embodiment, the reservoir 204 is coupled to the tubing unit 206 and the condensing unit 208. The reservoir 204 includes a first portion 210 and a second portion 212. The first portion 210 of the reservoir 204 is configured to store a liquid coolant, while the second portion 212 of the reservoir 204 is configured to collect the coolant evaporated from the first portion 210 of the reservoir 204. Further, the reservoir 204 includes a first outlet 213, a second outlet 214, and a third outlet 216. The first outlet 213 is coupled to an inlet 218 of the condensing unit 208 via a first channel 220. Moreover, the first outlet 213 of the reservoir 204 is configured to convey the evaporated coolant from the reservoir 204 to the condensing unit 208. Similarly, the second outlet 214 is coupled to the tubing unit 206 and configured to convey the liquid coolant from the first portion 210 of the reservoir 204 to the tubing unit 206. Furthermore, the third outlet 216 is coupled to a release valve 224 via a second channel 226. The release valve 224 is employed to release any in-built pressure of the reservoir 204.

In accordance with aspects of the present technique, the tubing unit 206 is configured to dissipate heat from the one or more superconducting units 202. In one exemplary embodiment, the tubing unit 206 is coupled to the reservoir 204 and the condensing unit 208. Particularly, the tubing unit 206 in combination with the reservoir 204 forms a cyclic loop for density driven circulation of the liquid coolant. The tubing unit 206, in one embodiment, includes an inlet 228, a base leg 230, a vertical leg 232, and two or more cyclic loops 234, 236, as depicted in FIG. 2. The inlet 228 is coupled to an outlet 238 of the condensing unit 208 via a third channel 240. Furthermore, the inlet 228 of the tubing unit 206 is configured to receive the condensed liquid coolant from the condensing unit 208. For example, the tubing unit 206 may initially be filled with the liquid coolant through the inlet 228.

Additionally, one end of the vertical leg 232 is coupled to the second outlet 214 of the reservoir 204, while the other end of the vertical leg 232 is coupled to the base leg 230, as depicted in FIG. 2. The vertical leg 232 is configured to receive the liquid coolant from the reservoir 204 and convey the received liquid coolant to the two cyclic loops 234, 236 via the base leg 230. Moreover, each of the two cyclic loops 234, 236 is disposed between the base leg 230 and the reservoir 204. Also, in certain other embodiments, these cyclic loops 234, 236 may be disposed around the one or more superconducting units 202 to dissipate heat from the one or more superconducting units 202.

In one exemplary embodiment, the condensing unit 208 may be coupled to the reservoir 204 and the tubing unit 206. The condensing unit 208 is configured to condense or cool the evaporated coolant that is received from the second portion 212 of the reservoir 204. The condensing unit 208 includes the inlet 218, a condenser 242, and the outlet 238. The inlet 218 of the condensing unit 208 is configured to receive the evaporated coolant from the second portion 212 of the reservoir 204. Further, the received evaporated coolant is conveyed to the condenser 242. The condenser 242 is configured to condense the received evaporated coolant to form the condensed liquid coolant. Upon condensing the evaporated coolant, the condensing unit 208 conveys the liquid coolant to the tubing unit 206 via the outlet 238 and the third channel 240.

It may be assumed that the tubing unit 206 and the first portion 210 of the reservoir 204 are initially filled with the liquid coolant. Further, in accordance with exemplary aspects of the present technique, the liquid coolant is circulated between the reservoir 204 and the tubing unit 206 by varying a density of the liquid coolant in the tubing unit 206. Particularly, the two cyclic loops 234, 236 that are disposed over the one or more superconducting units 202 are configured to absorb the heat generated by the one or more superconducting units 202. The density of the liquid coolant within the cyclic loops 234, 236 is reduced consequent to the absorption of heat by the liquid coolant circulating therein.

Furthermore, the coolant with reduced density in each of the cyclic loops 234, 236 travels along a direction 244, as shown in FIG. 2, towards the reservoir 204. Thereafter, the liquid coolant that is initially stored in the first portion 210 of the reservoir 204 is used to condense the coolant received from the cyclic loops 234, 236. Particularly, the absorbed heat in the received coolant is transferred to the liquid coolant that is stored in the reservoir 204. By transferring the absorbed heat, the received coolant may be condensed and the density of the coolant may be increased, thereby forming the liquid coolant. This condensed liquid coolant then travels along the vertical leg 232 of the tubing unit 206. This downward movement of the condensed liquid coolant in the vertical leg 232 is generally depicted by reference numeral 246 in FIG. 2. Thereafter, the condensed liquid coolant is conveyed to the cyclic loops 234, 236 via the base leg 230, where the condensed liquid coolant continues to absorb the heat generated by the one or more superconducting units 202. This cycle may be repeated to circulate the liquid coolant within the tubing unit 206, as depicted in FIG. 2.

Additionally, at the reservoir 204, while cooling the coolant received from the cyclic loops 234, 236 of the tubing unit 206, a portion of the liquid coolant in the first portion 210 of the reservoir 204 may be evaporated and stored in the second portion 212 of the reservoir 204. This evaporated coolant is conveyed to the condensing unit 208 via the first channel 220. At the condensing unit 208, the evaporated coolant is condensed and this condensed liquid coolant is conveyed back to the tubing unit 206 via the third channel 240. Thus, the one or more superconducting units 202 are cooled or maintained at the cryogenic temperature by using a minimal amount of liquid coolant. For example, about 10 liters of liquid coolant may be used in the thermosiphon cooling system 200 to cool the superconducting unit 202.

Figure 3:
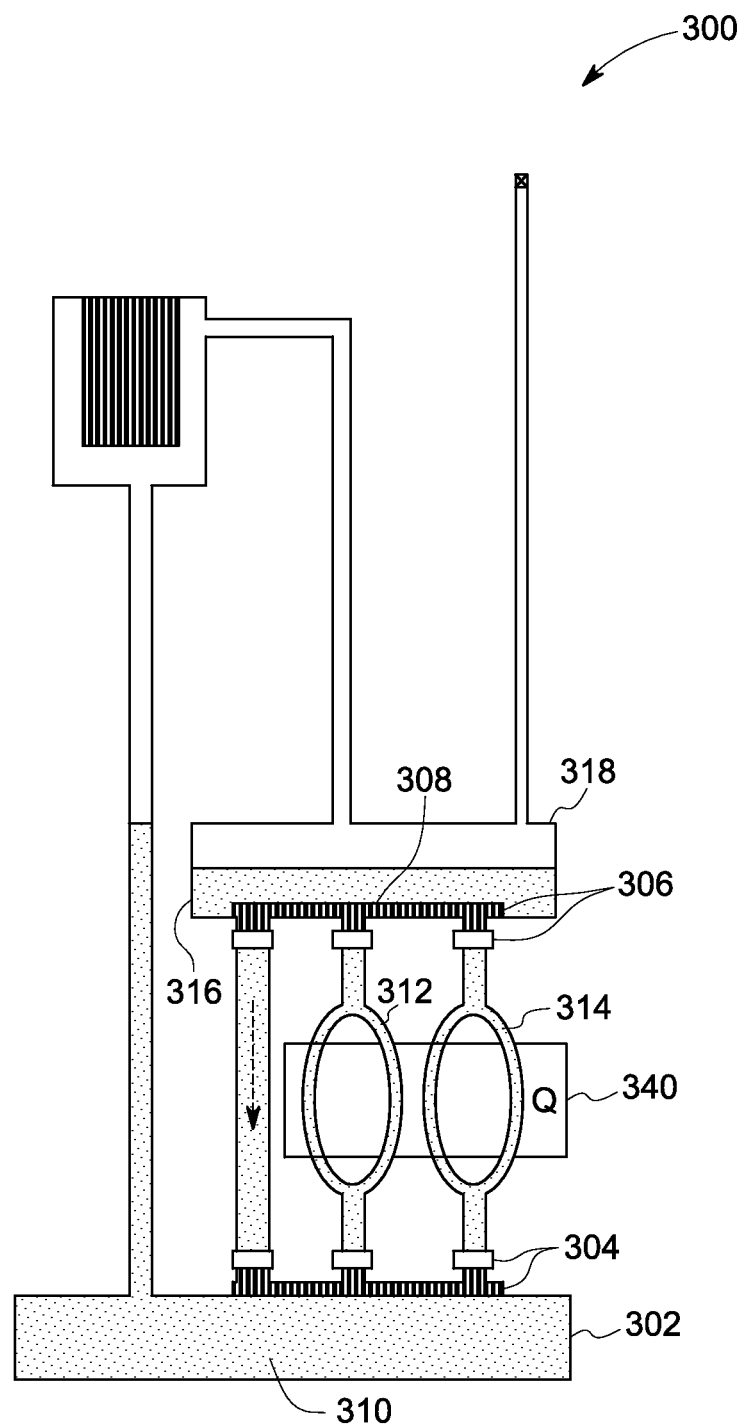
FIG. 3 is a cross-sectional view of the thermosiphon cooling system of FIG. 2 having manifolds and heat exchangers, in accordance with aspects of the present technique.

Turning now to FIG. 3, a cross-sectional view of another embodiment of a thermosiphon cooling system 300 is illustrated. In the present example, the thermosiphon cooling system 300 includes manifolds and heat exchangers, in accordance with aspects of the present technique. The embodiment of FIG. 3 is similar to the embodiment of FIG. 2, except that a tubing unit 302 of FIG. 3 includes one or more manifolds 304, 306 and a heat exchanger 308.

In a presently contemplated configuration, the tubing unit 302 includes the first manifold 304 and the second manifold 306. The first manifold 304 is coupled to a base leg 310 of the tubing unit 302 and configured to balance a liquid coolant flow distribution in each leg of the tubing unit 302. For example, conveying the liquid coolant to cyclic loops 312, 314 may result in one cyclic loop 312 having more liquid coolant flow than the other cyclic loop 314. This unbalanced flow of liquid coolant may further affect the circulation of liquid coolant within the tubing unit 302. Thus, to overcome the unbalanced circulation of coolant flow in the two cyclic loops 312, 314, the tubing unit 302 includes the first manifold 304 that balances the flow of liquid coolant from the base leg 310 to each of the cyclic loops 312, 314, as depicted in FIG. 3. In a similar manner, the second manifold 306 is coupled to a first portion 316 of a reservoir 318 and configured to balance the flow distribution of liquid coolant flow from the reservoir 318 to the tubing unit 302.

In addition, the tubing unit 302 includes the heat exchanger 308 that is coupled to the first portion 316 of the reservoir 318. The heat exchanger 308 is configured to distribute the heat absorbed by the liquid coolant. Particularly, the reservoir 318 receives the liquid coolant from the cyclic loops 312, 314, where the liquid coolant has been heated by the heat generated by a superconducting unit 340. This heat is transferred or distributed uniformly across the reservoir 318 by employing the heat exchanger 308. By distributing the heat, the number of gas bubbles in the reservoir 318 and/or the tubing unit 302 may be reduced or eliminated, which further enhances the flow of liquid coolant in the reservoir 318 and/or the tubing unit 302. In one embodiment, the heat exchanger 308 may include a finned heat exchanger.

Figure 4:
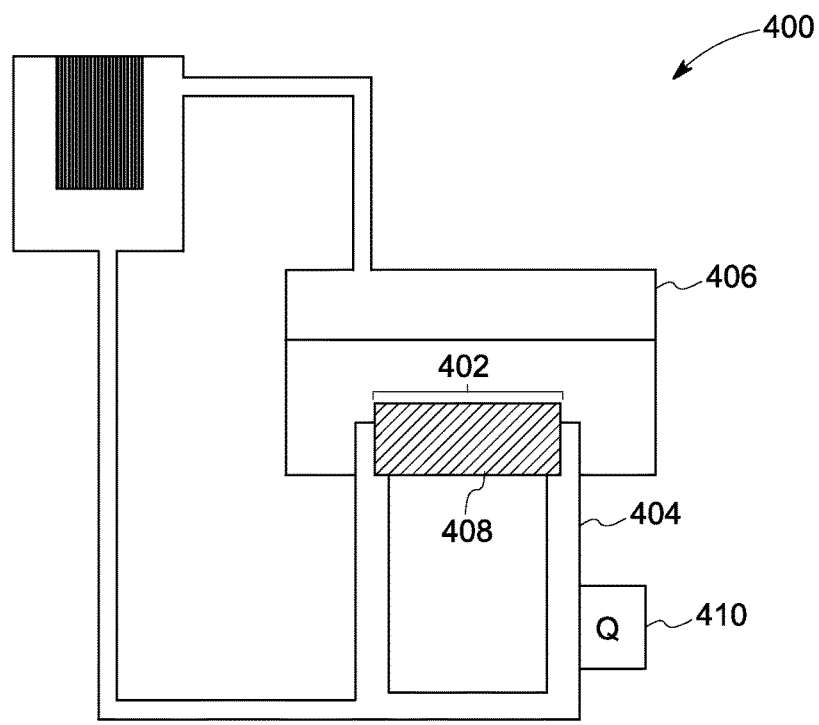
FIG. 4 is a cross-sectional view of one embodiment of a portion of thermosiphon cooling system of FIG. 1, in accordance with aspects of the present technique.

FIG. 4 is a cross-sectional view of a portion 400 of thermosiphon cooling system of FIG. 1, in accordance with aspects of the present technique. The embodiment of FIG. 4 is similar to the embodiment of FIG. 1, except that a portion 402 of a tubing unit 404 that is disposed within a reservoir 406 is coupled to a heat exchanger 408.

In the exemplary embodiment of FIG. 4, the heat exchanger 408 is configured to reduce gas bubbles in the liquid coolant that is circulated within the tubing unit 404. Particularly, the heat exchanger 408 distributes the absorbed heat in the liquid coolant of the tubing unit 404 across the liquid coolant in the reservoir 406. This distribution of heat further helps in reducing the number of the gas bubbles or size of gas bubbles within the tubing unit 404. For example, subsequent to absorbing the heat generated by a superconducting unit 410, a portion of the liquid coolant in the tubing unit 404 may be evaporated. This evaporated liquid coolant may travel towards the portion 402 of the tubing unit 404 disposed within the reservoir 406. Further, once this evaporated coolant is condensed, a portion of the coolant may form gas bubbles within the tubing unit 404. These gas bubbles may combine together and block the liquid coolant from being circulated within the tubing unit 404. To overcome these problems, the heat exchanger 408 is employed to transfer and distribute the heat from the liquid coolant within the tubing unit 404 to the liquid coolant in the reservoir 406. This transfer and distribution of heat prevents formation of gas bubbles in the tubing unit 404.

Figure 5:
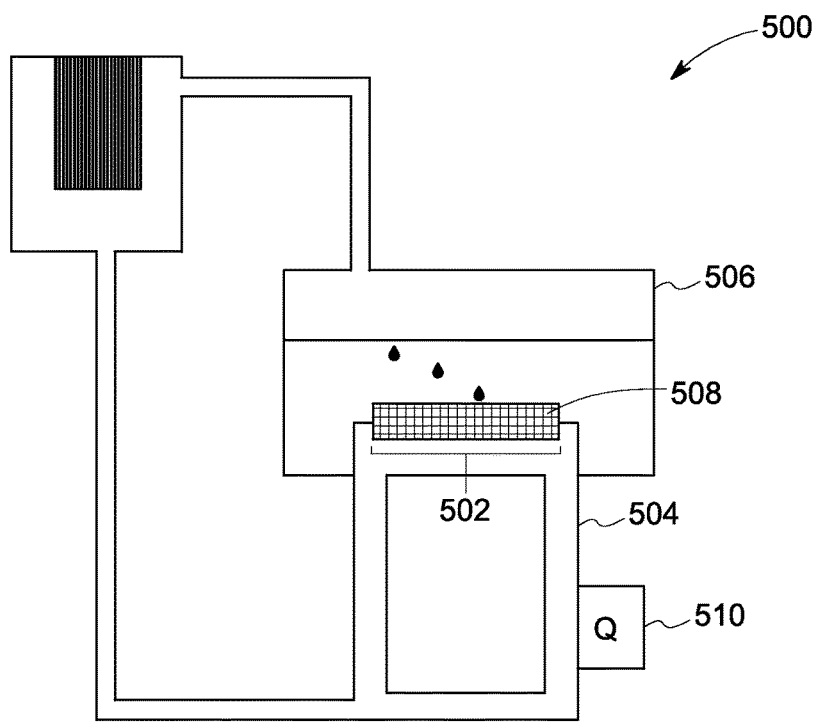
FIG. 5 is a cross-sectional view of another embodiment of a portion of thermosiphon cooling system of FIG. 1, in accordance with aspects of the present technique.

Referring now to FIG. 5, a cross-sectional view of a portion 500 of the thermosiphon cooling system 100 of FIG. 1, in accordance with aspects of the present technique, is depicted. The embodiment of FIG. 5 is similar to the embodiment of FIG. 1, except that a portion 502 of a tubing unit 504 that is disposed within a reservoir 506 includes a perforated tube 508. The perforated tube 508 is configured to release gas bubbles that are formed within the tubing unit 504. For example, when the tubing unit 504 absorbs the heat generated by a superconducting unit 510, the liquid coolant within the tubing unit 504 evaporates and travels towards the portion 502 of the tubing unit 504 disposed within the reservoir 506. This evaporated coolant may have one or more gas bubbles and these gas bubbles may combine together to form an enlarged gas bubble. Further, the enlarged gas bubble may block the flow of liquid coolant within the tubing unit 504. Thus, in order to reduce or eliminate the gas bubbles in the tubing unit 504, the tubing unit 504 includes the perforated tube 508 that allows the gas bubbles to be released from the tubing unit 504. Particularly, the portion 502 of the tubing unit 504 within the reservoir 506 includes the perforated tube 508 to aid in the release of gas bubble collective out of the tubing unit 504. It may be noted that the gas bubble collective may also be referred to as warm gas pockets. In one embodiment, the portion 502 of the tubing unit 504 may be inclined by an angle of about 5 degrees from a base of the reservoir 506 to eliminate accumulation of gas bubbles/warm-gas pockets in the tubing unit 504.

Figure 6:
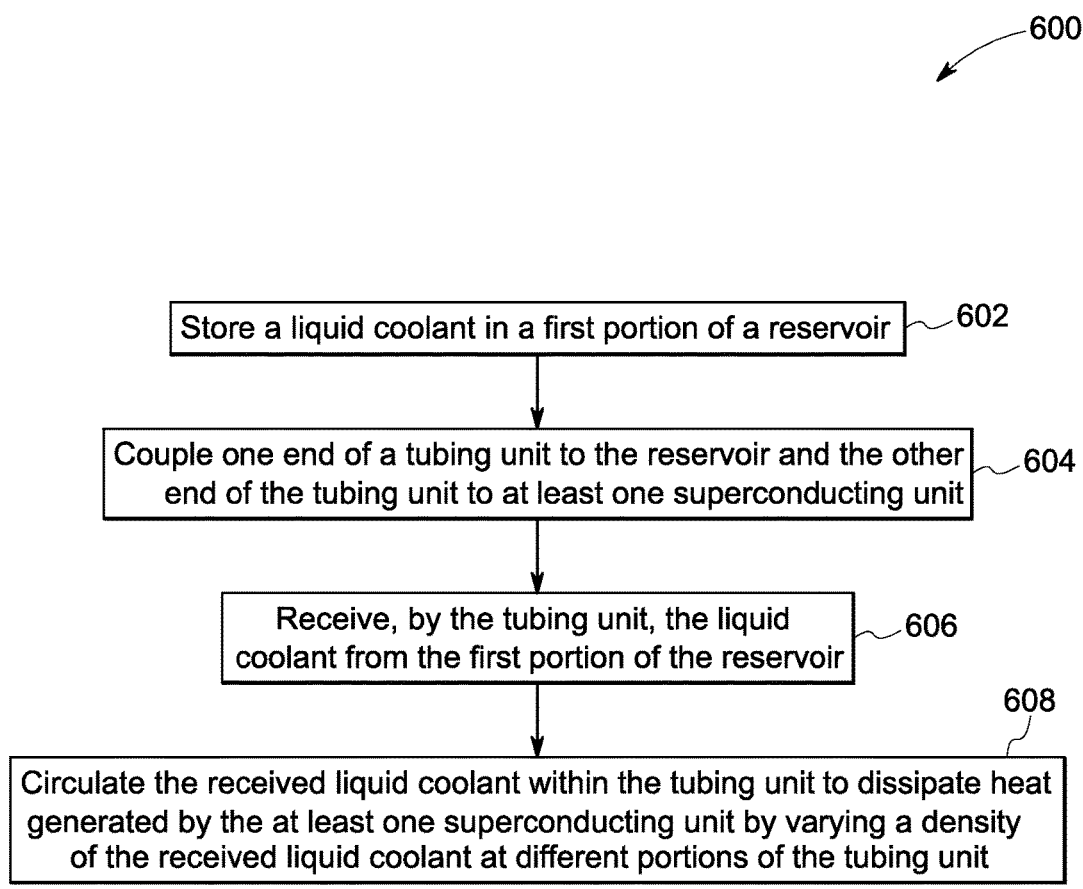
FIG. 6 is a flow chart illustrating a method for cooling a superconducting unit using a thermosiphon cooling system, in accordance with aspects of the present technique.

FIG. 6 is a flow chart 600 illustrating a method for cooling a superconducting unit using a thermosiphon cooling system, in accordance with aspects of the present technique. For ease of understanding of the present technique, the method is described with reference to the components of FIG. 1. Although the method is described with reference to the components of FIG. 1, it may be noted that depending on the maximum heat load experienced or design goal, the method may also be described using any of the thermosiphon cooling systems shown in FIGS. 2-5. For example, the method may use the thermosiphon cooling system 500 of FIG. 5 having the perforated tube 508 for cooling a superconducting unit having high transient heat loads.

The method begins at step 602, where a reservoir, such as the reservoir 104 of FIG. 1 is filled with a liquid coolant in the first portion 110 of the reservoir 104. Also, the second portion 112 of the reservoir 104 is configured to collect any coolant evaporated from the first portion of the reservoir 104. The first portion 110 of the reservoir 104 receives the liquid coolant from the condensed cooling unit 108.

Further, at step 604, one end of a tubing unit, such as the tubing unit 106 of FIG. 1, is coupled to the reservoir 104 and the other end of the tubing unit 106 is coupled to the superconducting unit 102. Particularly, in one embodiment, the tubing unit 106 may be disposed over the superconducting unit 102 and configured to dissipate heat generated by the superconducting unit 102 to reduce the temperature of the superconducting unit 102 to or below the cryogenic temperature. Concurrently, a portion 136 of the tubing unit 106 may be coupled to or disposed within the reservoir 104 to transfer the absorbed heat to the liquid coolant in the reservoir 104.

Additionally, at step 606, the tubing unit 106 is configured to receive the liquid coolant from the first portion 110 of the reservoir 104. Particularly, the tubing unit 106 includes an inlet, such as the inlet 128 of FIG. 1 that is coupled to an outlet of the reservoir 104, such as the outlet 114 of FIG. 1. This inlet 128 of the tubing unit 106 is configured to receive the liquid coolant from the outlet 114 of the reservoir 104 via a channel, such as the third channel 130 of FIG. 1.

Furthermore, at step 608, the tubing unit 106 is configured to circulate the received liquid coolant within the tubing unit 106 to dissipate heat generated by the at least one superconducting unit 102. In accordance with exemplary aspects of the present technique, the received liquid coolant is circulated within the tubing unit 106 by varying a density of the received liquid coolant at different portions of the tubing unit 106. Particularly, the liquid coolant within the tubing unit 106 is configured to absorb the heat generated by the superconducting unit 102. This absorption of heat reduces the density of the liquid coolant in the tubing unit 106. The liquid coolant with the reduced density travels along the first leg 142 towards the portion 136 of the tubing unit 106 that is disposed within the reservoir 104, as depicted by the direction 144 in FIG. 1. In one embodiment, the tubing unit 106 may have a channel diameter in a range from about 0.58 mm to about 5 mm to allow the gas bubbles to travel towards the portion 136 of the tubing unit 106. Also, the portion 136 of the tubing unit 106 may be inclined by an angle of about 5 degrees from a base of the reservoir 104 to eliminate accumulation of gas bubbles and to maintain velocity of the coolant flow in the tubing unit 106.

Thereafter, at the portion 136 of the tubing unit 106, the liquid coolant with reduced density is cooled or condensed by transferring the absorbed heat to the liquid coolant in the first portion 110 of the reservoir 104. By transferring the absorbed heat, the coolant in the portion 136 of tubing unit 106 is condensed, which in turn increases the density of the liquid coolant. This condensed liquid coolant then travels along the second leg 148 of the tubing unit 106 towards the superconducting unit 102. The movement of the condensed liquid coolant in the second leg 146 is shown by a direction 148 in FIG. 1. The condensed liquid coolant is then circulated within the tubing unit 106 to absorb the heat generated by the superconducting unit 102. This cycle is repeated to circulate the coolant within the tubing unit 106, as depicted in FIG. 1.

Figure 7:
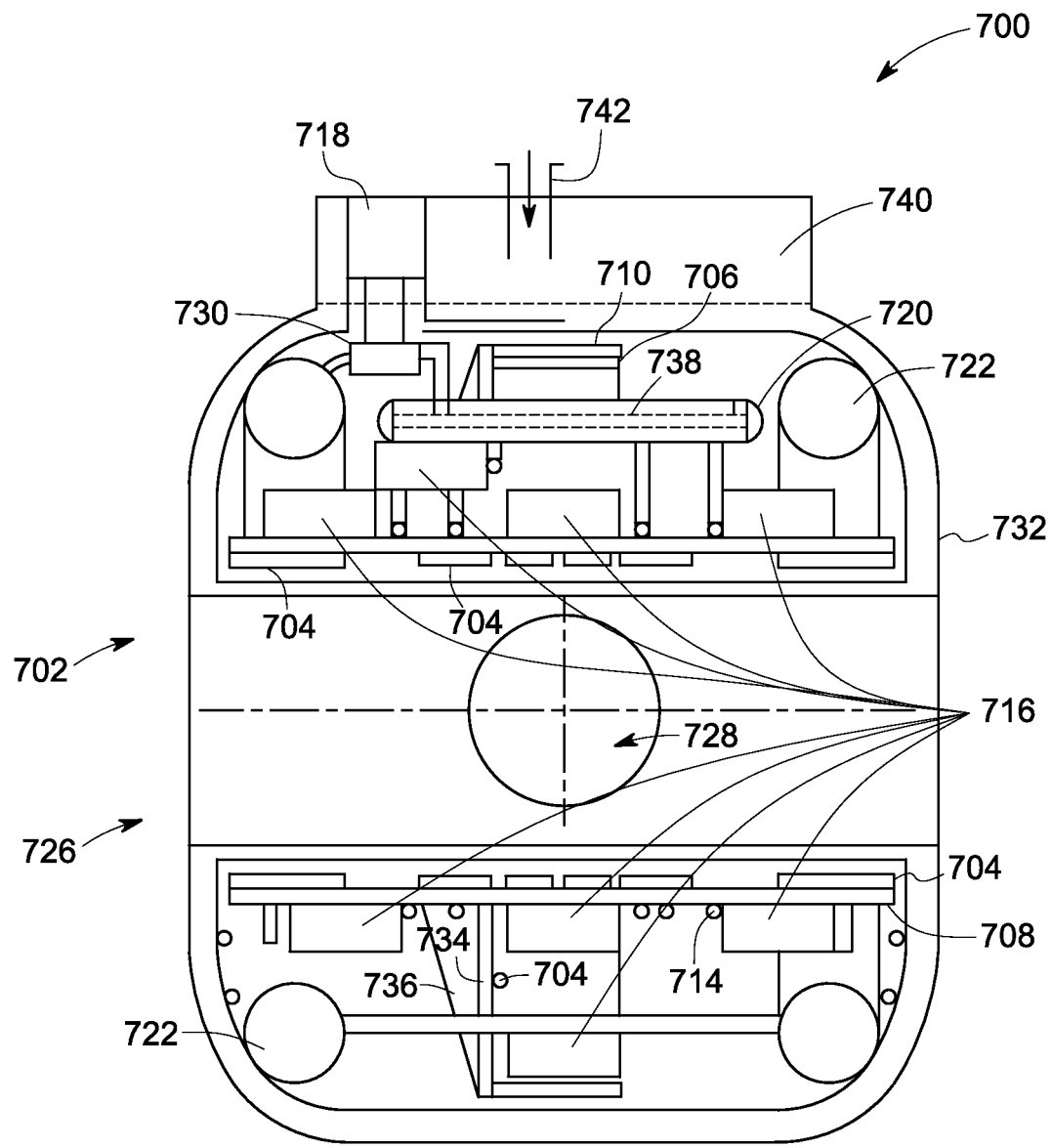
FIG. 7 is a side schematic view of an MRI imaging system that includes the thermosiphon cooling system of FIG. 1.

FIG. 7 is a cross sectional view of an MRI system 700 that includes the thermosiphon cooling system 100 (see FIG. 1), in accordance with aspects of the present technique. The MRI magnet system 700 of FIG. 7 is a low cryogen MRI magnet arrangement providing cryorefrigeration. In this embodiment, the MRI magnet system 700 includes a superconducting MRI magnet 702 formed from concentric superconducting main coils 704 and bucking coils 706 supported inside cylindrical shells (a coil support shell 708 and a coil support shell 710) of high thermal conductivity, and cooled by the cryorefrigerator 718 through a helium thermosiphon system, such as the thermosiphon cooling system 100 of FIG. 1. Thus, there is radial spacing between the superconducting main coils 704 and the bucking coils 706, which are each supported on different coil support shells 708 and 710, respectively. The coil support shells 708, 710 are formed as cylindrical shells with cooling tubes 714 thermally coupled (e.g., bonded) to an outside surface of the coil support shell 708. For example, the coil support shells 708, 710 may have circumferentially extending solid metal walls that define a bore therein.

In addition, the MRI system 700 includes the thermosiphon cooling system that is used to maintain a temperature of the superconducting main coils 704 and/or bucking coils 706 at a cryogenic temperature as described with reference to FIGS. 1-6. Further, the cryorefrigerator 718 and He storage vessels (illustrated as tanks forming a liquid He storage system 720) may be representative of the condensing unit 108 and/or the reservoir 104 of FIG. 1.

The superconducting coils 704 and/or the bucking coils 706 are molded with epoxy resin. For example, the molded coils may be wound with wet epoxy and cured to form self-supporting structures. The superconducting coils 704 and/or the bucking coils 706 then may be bonded to the coil support shells 708 and 710, respectively. The formed superconducting coils 704 and/or the bucking coils 706 are sized to define a bore 726 therethrough which is used to image an object (e.g., a patient). For example, a field of view (FOV) 728 may be defined to image a particular portion of the object.

Moreover, a helium thermosiphon arrangement includes an evaporator system with the plurality of the cooling tubes 714 thermally attached to the coil support shells 708 and/or 710, a recondenser 730 thermally attached to the cryorefrigerator 718, and He storage vessels 720, 722, all contained inside a magnet vacuum vessel 732. In one embodiment, the thermosiphon cooling system, such as the thermosiphon cooling system 100 of FIG. 1 is operatively coupled to the superconducting units via the cooling tubes 714. It may be noted that FIG. 7 shows one or more possible locations and arrangements of the thermosiphon cooling system, such as the thermosiphon cooling system 100 of FIG. 1, in a low cryogen magnet or MRI system 700.

Additionally, the helium thermosiphon system includes two toroidal shaped He gas storage tanks 722, which contain about 200 to 300 liters of He gas, which varies based on the amount of cooling needed or desired. In various embodiments, the liquid He storage tank 720 receives liquid He from the recondenser 730, and supplies liquid He to the cooling tubes 714 coupled to the cold mass support structure, namely the coil support shells 708 and/or 710.

Moreover, manifold 738 receives vapor He (He gas) from the cooling tubes 714 and returns the He gas to the recondenser 730. The He gas storage tanks 722 are charged initially with between 30 and 40 atm He gas at ambient temperature. In operation, when the cryorefrigerator 718 is energized or turned ON, the recondenser 730 draws He from the He gas storage tank 722, and sets up a free convection circulation loop that cools down the coils 704 and 706 and the support mass structure (the coil support shells 708 and/or 710) to a cryogenic temperature, as well as fills the liquid He storage tank 720 with between about 8 and 10 liters of liquid He. In operation, the liquid He in the liquid He storage tank 720 is used to provide cooling to the magnet 702 and persistent current switches 716, for example, during power interruptions, or shut down of the cryorefrigerator 718, such as for service up to 10-12 hours. In various embodiments, once the thermosiphon system is turned ON, the system cools itself, thereby forming a free convection circulation system. It may be noted that the MRI magnet system 700 also includes a service box 740, receiving power leads 742 for powering the coils 704 and 706, as well as other components of the MRI magnet system 700.

Thus, various embodiments provide an MRI magnet system 700 having molded superconducting coils and persistent current switches that are conduction cooled and structurally supported by high thermal conductivity cylindrical shells, which can operate at a temperature of 4.2 K. Moreover, the magnet weight is reduced by eliminating a large liquid He storage vessel that is typically used for cooling the superconducting magnets, and by making the coil support components out of aluminum. In various embodiments, no servicing or adding of cryogen is needed and the overall system weight is between about 2000 pounds and 2500 pounds.

The systems and methods as described herein above may also be used to retrofit a thermosiphon cooling system, such as the thermosiphon cooling system 100 of FIG. 1 for cooling at least one superconducting unit in the MRI system. More particularly, the reservoir 104 and the tubing unit 106 (see FIG. 1) may be retrofit to the existing infrastructure of the MRI system. Furthermore, in certain embodiments, the reservoir 104 includes the first portion 110 that is configured to store a liquid coolant while, the tubing unit 106 is coupled to the reservoir 104 and disposed adjacent to the at least one superconducting unit 102 to be cooled. The tubing unit 106 may be configured to receive the liquid coolant from the first portion 110 of the reservoir 104, and circulate the received liquid coolant within the tubing unit 106 to dissipate heat generated by the at least one superconducting unit 102. Particularly, the received liquid coolant is circulated within the tubing unit 106 by varying a density of the received liquid coolant at different portions of the tubing unit 106.

The various embodiments of the exemplary thermosiphon cooling systems and the method for cooling the superconducting units described hereinabove aid in reducing the manufacture cost and weight of magnetic device, such as the MRI systems. Moreover, since the evaporated coolant is re-condensed and circulated within the tubing unit, use of thousands of liters of coolant or liquid He in the reservoir or storage vessel may be dramatically reduced. Also, the coolant is circulated within the tubing unit without use of additional/external pumping device. Furthermore, the coolant circulating in the tubing unit, known as a thermosiphon cooling loop, is a high-efficiency thermoconvective loop which provides a very stable and enhanced cooling performance in the MRI system even with transient operating conditions. Moreover, the thermosiphon cooling loop is self-adapting to transient heat loads. For example, the circulation of coolant in the tubing unit is automatically controlled based on the heat loads imposed on the superconducting unit. In addition, the systems and method provides maximum cooling efficiency with minimal configuration changes to the existing cooling arrangement in the MRI system. Further, this higher cooling efficiency of the system helps in pushing the performance of the superconducting coil/wire to a higher level and at the same time increases the cryostability of the superconducting wire/unit.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A thermosiphon cooling system, comprising:
a reservoir comprising a liquid coolant; and
a tubing unit comprising at least a first portion and a second portion and an inlet coupled to the second portion of the tubing unit, wherein:
the first portion of the tubing unit is disposed in the liquid coolant within the reservoir and the second portion of the tubing unit is disposed in direct contact with at least one superconducting unit to be cooled;
the first portion and the second portion of the tubing unit are coupled to each other to form a cyclic tubing loop, wherein the cyclic tubing loop comprises an inner wall and an outer wall, wherein an exterior surface of the inner wall is disposed in direct contact with the at least one superconducting unit to be cooled;
the inlet of the tubing unit is coupled to the reservoir via a channel and configured to receive the liquid coolant from the reservoir and convey the received liquid coolant to the second portion of the tubing unit;
the tubing unit is configured to circulate the received liquid coolant between an interior surface of the inner wall and an interior surface of the outer wall of the cyclic tubing loop of the tubing unit to dissipate heat generated by the at least one superconducting unit; and
the received liquid coolant is circulated within the tubing unit by varying a density of the received liquid coolant at different portions comprising at least the first portion and the second portion of the tubing unit.

2. The thermosiphon cooling system of claim 1, further comprising a condensing unit coupled to the reservoir and configured to condense the liquid coolant evaporated from the reservoir.

3. The thermosiphon cooling system of claim 2, wherein the condensing unit comprises:
a first inlet coupled to the reservoir via a first channel and configured to receive the evaporated coolant from the reservoir;
a condenser configured to condense the received evaporated coolant to form the liquid coolant; and
an outlet coupled to the reservoir via a second channel and configured to convey the liquid coolant to the reservoir.

4. The thermosiphon cooling system of claim 2, wherein the reservoir is configured to store the evaporated liquid coolant.

5. The thermosiphon cooling system of claim 1, wherein the tubing unit is configured to vary the density of the received liquid coolant by absorbing the heat generated by the at least one superconducting unit at one end of the tubing unit and transferring the absorbed heat to the liquid coolant in the reservoir at the other end of the tubing unit.

6. The thermosiphon cooling system of claim 5, wherein the tubing unit is configured to:
reduce the density of the received liquid coolant when the received liquid coolant absorbs the heat generated by the at least one superconducting unit; and
increase the density of the received liquid coolant when the absorbed heat is transferred from the received liquid coolant within the tubing unit to the liquid coolant in the reservoir.

7. The thermosiphon cooling system of claim 1, wherein the tubing unit is configured to circulate the received liquid coolant within the tubing unit without use of a pumping device.

8. The thermosiphon cooling system of claim 1, wherein the tubing unit comprises a perforated tube configured to convey gas bubbles in the liquid coolant out of the tubing unit.

9. The thermosiphon cooling system of claim 1, wherein the tubing unit comprises at least one manifold configured to distribute flow of the liquid coolant in the tubing unit.

10. The thermosiphon cooling system of claim 1, wherein the tubing unit comprises:
a first leg coupled to the reservoir and configured to receive the liquid coolant from the reservoir;
at least one cyclic loop disposed over the at least one superconducting unit and configured to:
receive the liquid coolant from the first leg of the tubing unit;
reduce the density of the liquid coolant by absorbing the heat generated by the at least one superconducting unit; and
convey the liquid coolant to the reservoir after reducing the density of the liquid coolant.

11. The thermosiphon cooling system of claim 1, further comprising a heat exchanger thermally coupled to the tubing unit and configured to reduce gas bubbles in the received liquid coolant circulated in the tubing unit.

12. The thermosiphon cooling system of claim 1, further comprising a release valve coupled to the reservoir and configured to release in-built pressure of the reservoir.

13. A system, comprising:
at least one superconducting unit configured to produce a magnetic field; and
a thermosiphon cooling subsystem coupled to the at least one superconducting unit and configured to dissipate heat generated by the at least one superconducting unit while producing the magnetic field, wherein the thermosiphon cooling subsystem comprises:
a reservoir comprising a liquid coolant; and
a tubing unit comprising at least a first portion and a second portion and an inlet, wherein:
the first portion of the tubing unit is disposed in the liquid coolant within the reservoir and the second portion of the tubing unit is disposed in direct contact with the at least one superconducting unit;
the first portion and the second portion of the tubing unit are coupled to each other to form a cyclic tubing loop, wherein the cyclic tubing loop comprises an inner wall and an outer wall, wherein an exterior surface of the inner wall is disposed in direct contact with the at least one superconducting unit to be cooled;
the inlet of the tubing unit is coupled to the reservoir via a channel and configured to receive the liquid coolant from the reservoir and convey the received liquid coolant to the second portion of the tubing unit;
the tubing unit is configured to circulate the received liquid coolant between an interior surface of the inner wall and an interior surface of the outer wall of the cyclic tubing loop of the tubing unit to dissipate the heat generated by the at least one superconducting unit; and
the received liquid coolant is circulated within the tubing unit by varying a density of the received liquid coolant at different portions comprising at least the first portion and the second portion of the tubing unit.

14. The system of claim 13, wherein the tubing unit is configured to vary the density of the received liquid coolant by absorbing the heat generated by the at least one superconducting unit at one end of the tubing unit and transferring the absorbed heat to the liquid coolant in the reservoir at the other end of the tubing unit.

15. The system of claim 13, wherein the thermosiphon cooling subsystem is configured to maintain a temperature of the at least one superconducting unit at or below a cryogenic temperature.

16. A thermosiphon cooling kit for cooling at least one superconducting unit, comprising:
a reservoir comprising a liquid coolant; and
a tubing unit comprising at least a first portion and a second portion and an inlet coupled to the second portion of the tubing unit;
the first portion of the tubing unit is disposed in the liquid coolant within the reservoir and the second portion of the tubing unit is disposed in direct contact with the at least one superconducting unit to be cooled;
the first portion and the second portion of the tubing unit are coupled to each other to form a cyclic tubing loop, wherein the cyclic tubing loop comprises an inner wall and an outer wall, wherein an exterior surface of the inner wall is disposed in direct contact with the at least one superconducting unit to be cooled;
the inlet of the tubing unit is coupled to the reservoir via a channel and configured to receive the liquid coolant from the reservoir and convey the received liquid coolant to the second portion of the tubing unit;
the tubing unit is configured to circulate the received liquid coolant between an interior surface of the inner wall and an interior surface of the outer wall of the cyclic tubing loop of the tubing unit to dissipate heat generated by the at least one superconducting unit; and
the received liquid coolant is circulated within the tubing unit by varying a density of the received liquid coolant at different portions comprising at least the first portion and the second portion of the tubing unit.

* * * * *